US005212460A

United States Patent [19]

Tamagawa

[11] Patent Number: 5,212,460

[45] Date of Patent: May 18, 1993

[54] CRYSTAL OSCILLATION CIRCUIT WITH VOLTAGE REGULATING CIRCUIT

[75] Inventor: Akio Tamagawa, Tokyo, Japan

[73] Assignee: NEC Coporation, Tokyo, Japan

[21] Appl. No.: 818,624

[22] Filed: Jan. 10, 1992

[30] Foreign Application Priority Data

Jan. 10, 1991 [JP] Japan .................................... 3-1329

[51] Int. Cl.[5] .............................................. H03B 5/36

[52] U.S. Cl. ............................ 331/116 FE; 331/158; 331/186

[58] Field of Search ............ 331/116 FE, 116 R, 158, 331/160, 186; 368/159, 204

[56] References Cited

U.S. PATENT DOCUMENTS 4,208,639 6/1980 Stickel .......................... 331/116 FE
4,956,618 9/1990 Ulmer ........................... 331/116 FE

*Primary Examiner*—Siegfried H. Grimm
*Attorney, Agent, or Firm*—Laff, Whitesel, Conte & Saret

[57] ABSTRACT

A crystal oscillation circuit has a constant-current load type inverter circuit receiving a regulated supply voltage from a voltage regulating circuit and functioning as an inverting amplifier for oscillation; a feedback circuit connected between an input and an output terminal of the inverter circuit and including a resistor and capacitors; and a crystal resonator connected between the input and output terminals of the inverter circuit. The inverter circuit is formed by a constant-current source and a P-channel type MOS-FET or an N-channel type MOS-FET. As the supply voltage from the voltage regulating circuit necessary as an oscillation starting voltage can be set at a low level, the current consumption of the overall oscillation circuit can be effectively reduced.

4 Claims, 2 Drawing Sheets

CRYSTAL OSCILLATION CIRCUIT WITH VOLTAGE REGULATING CIRCUIT

BACKGROUND OF THE INVENTION (1) Field of the Invention

The present invention relates to a crystal oscillation circuit and, more particularly, to a crystal oscillation circuit which is constituted by a MOS field effect transistor and which is operable in low power consumption.

(2) Description of the Related Art

FIG. 1 is a schematic circuit diagram showing an example of a conventional crystal oscillation circuit of a low power consumption type. As shown in FIG. 1, such oscillation circuit comprises a voltage regulating circuit 1, a CMOS inverter circuit 2 consisting of a P-channel MOS field effect transistor (hereinafter referred to as "PMOS-FET") 3 and an N-channel MOS field effect transistor (hereinafter referred to as "NMOS-FET") 4, a resistor 5, a crystal resonator 6, and capacitors 7 and 8. The crystal oscillation circuit of the type which is frequently and ordinarily used is formed, with respect to an output of the voltage regulating circuit 1, by such CMOS inverter circuit 2 which functions as an amplifier, a feedback circuit which includes the resistor 5 and the capacitors 7, 8, and the crystal resonator 6.

The conventional crystal oscillation circuit explained above is formed by a complementary pair of the PMOS-FET 3 and the NMOS-FET 4, however, as the gate voltage $V_G$ of the CMOS inverter circuit 2 oscillates substantially in sinusoidal waves with a result that a through-current flows in the CMOS inverter circuit 2 and thus the current consumption becomes high as shown by a voltage-current characteristic curve 101 in FIG. 2 and, moreover, the power consumption greatly increases with the rise of the power source voltage supplied to the circuit. In order to cope with this problem, conventionally, the crystal oscillation circuit in which low power consumption is required is provided with such voltage regulating circuit 1 as shown in FIG. 1, whereby the power source voltage supplied to the CMOS inverter circuit 2 is restricted so as to suppress the power consumption.

In the conventional crystal oscillation circuit of a low power consumption type explained above, in order to enable the oscillation to start, it is necessary to maintain the output voltage of the voltage regulating circuit 1 at a voltage higher than $|V_{TP}|+V_{TN}$ and this is one of the reasons that the realization of a circuit with a low power consumption is being hindered. Here, the voltage $V_{TP}$ is a threshold voltage of the PMOS-FET 3 and the voltage $V_{TN}$ is a threshold voltage of the NMOS-FET 4. That the oscillation circuit does not oscillate unless the output voltage of the voltage regulating circuit 1 is maintained at or higher than $|V_{TP}|+V_{TN}$ is accounted for by the reason that, since between the input and output terminals of the CMOS inverter circuit 2 is connected the feedback resistor 5, the supply voltages for the respective PMOS-FET 3 and NMOS-FET 4 become approximately half the power source voltage and, under this state, both the PMOS-FET 3 and the NMOS-FET 4 are in their OFF-states thereby preventing the start of oscillation.

A voltage-current characteristic line 102 in FIG. 2 shows the current consumption by the conventional crystal oscillation circuit of a low power consumption type. As apparent from this line 102, with the maintenance of the power supply voltage at or higher than $|V_{TP}|+V_{TN}$, the power supply current, that is, the consumption current remains at a considerably high level and, thus, it is a disadvantage that the power consumption is still large.

SUMMARY OF THE INVENTION

It is, therefore, an object of the present invention to overcome the problems existing in the conventional crystal oscillation circuit and to provide an improved crystal oscillation circuit wherein the power consumption is effectively reduced.

According to the invention, there is provided a crystal oscillation circuit which comprises:

a voltage regulating circuit for outputting a predetermined regulated output voltage;

a constant-current load type inverter circuit having a constant-current source and a P-channel type or an N-channel type MOS field effect transistor, the inverter circuit receiving the output voltage from the voltage regulating circuit;

a crystal resonator connected between an input and an output terminal of the inverter circuit; and a feedback circuit connected between the input and output terminals of the inverter circuit and having a resistor and capacitors.

According to the present invention, by using the constant-current load type inverter circuit as an inverting amplifier for oscillation, the supply voltage from the voltage regulating circuit necessary as an oscillation starting voltage can be effectively suppressed to a low level, thereby enabling to make a substantial reduction in the current consumption.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Now, preferred embodiments of the invention will be explained with reference to the accompanying drawings.

Figure 3:
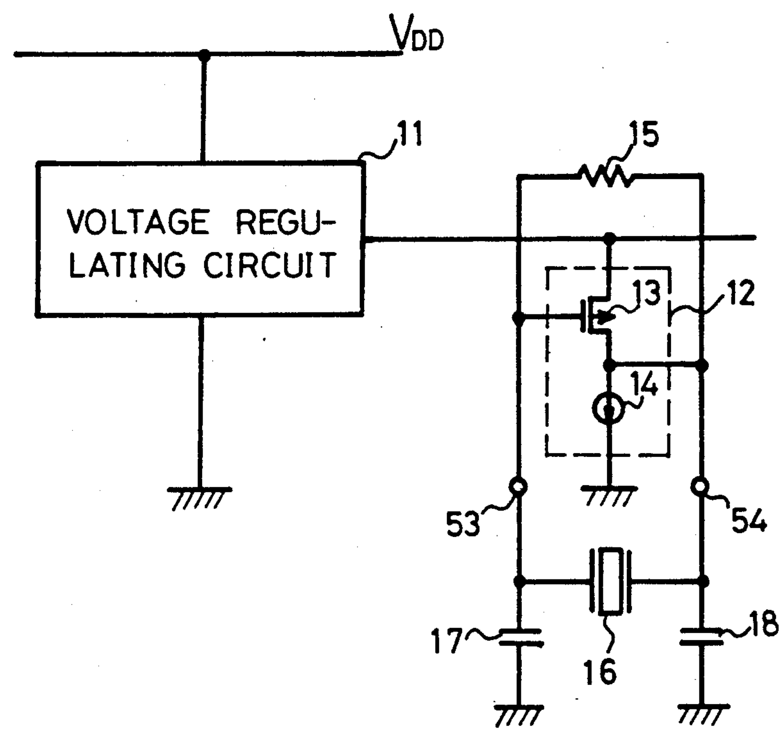
FIG. 3 is a schematic circuit diagram of a low power consumption type crystal oscillation circuit of a first embodiment according to the invention.

First, FIG. 3 is a schematic circuit diagram of a crystal oscillation circuit of a first embodiment according to the invention. As shown in FIG. 3, the circuit of this embodiment comprises a voltage regulating circuit 11; a constant-current load type inverter circuit 12 including a PMOS-FET 13 and a constant-current source 14; a resistor 15; a crystal resonator 16; and capacitors 17, 18. In other words, the oscillation circuit is formed, with respect to the output of the voltage regulating circuit 11, by the constant-current load type inverter circuit 12;

a feedback circuit which includes the resistor 15 and the capacitors 17, 18 and which is connected between input and output terminals 53, 54 of the inverter circuit 12; and the crystal resonator 16 which is also connected between the input and output terminals 53, 54.

The output voltage of the voltage regulating circuit 11 is connected and supplied to a power supply terminal of the constant-current load type inverter circuit 12, that is, to the source electrode of the PMOS-FET 13. Between the input and output terminals 53, 54 of the constant-current load type inverter circuit 12 is connected the feedback resistor 15. The circuit including the constant-current load type inverter circuit 12 and the feedback resistor 15 operates as an inverting amplifier with a gain in the order of ten or more dB (decibels) to several tens dB. Between the input and output terminals 53, 54 of this inverting amplifier is connected a $\pi$-type feedback circuit consisting of the crystal resonator 16 and the capacitors 17, 18, whereby the overall circuit performs a predetermined oscillating operation.

Figure 1:
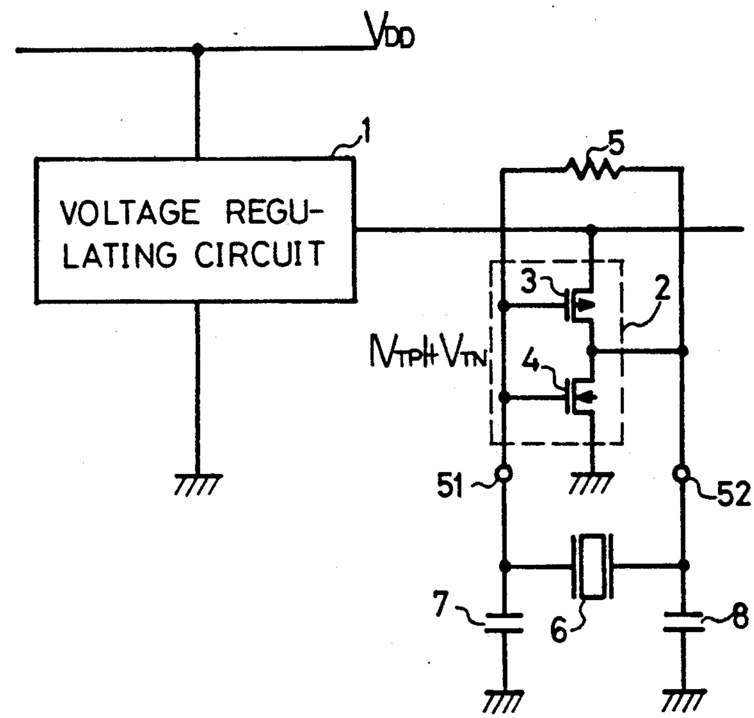
FIG. 1 is a schematic circuit diagram of a conventional crystal oscillation circuit of a low power consumption type.
Figure 2:
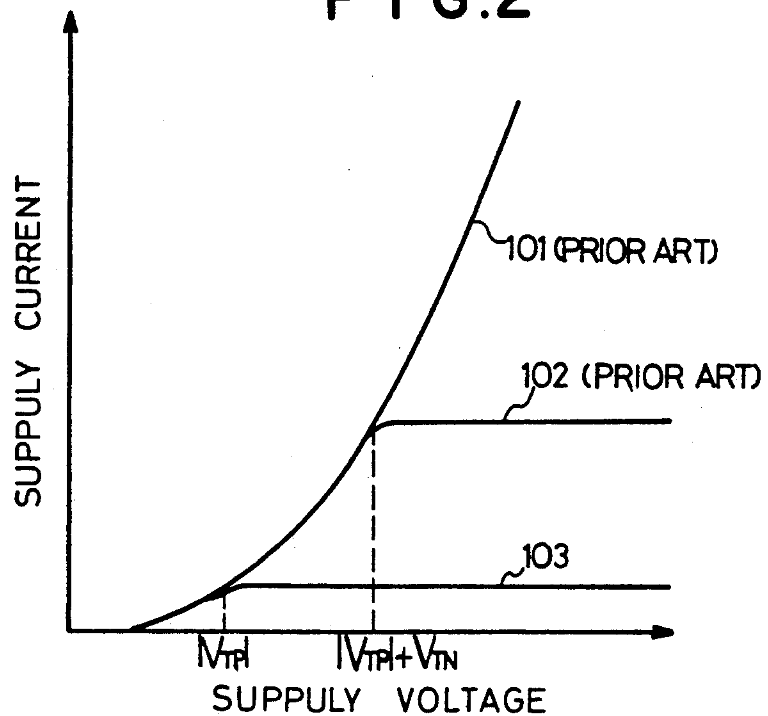
FIG. 2 is a graph showing supply voltage-supply current characteristic lines of the oscillation circuits concerned.

The output voltage of the voltage regulating circuit 11 is set to a voltage in the order of $|V_{TP}|$ which is an operation start voltage for the constant-current load type inverter circuit 12. In this way, the current consumed by the crystal oscillation circuit according to the present invention is as shown by a voltage-current characteristic line 103 in FIG. 2, from which it is readily understood that, for the supply voltage higher than $|V_{TP}|$, the level of the supply current, that is, the current consumption is maintained at a very low and constant level.

Next, a crystal oscillation circuit of a second embodiment according to the invention is explained with reference to FIG. 4.

Figure 4:
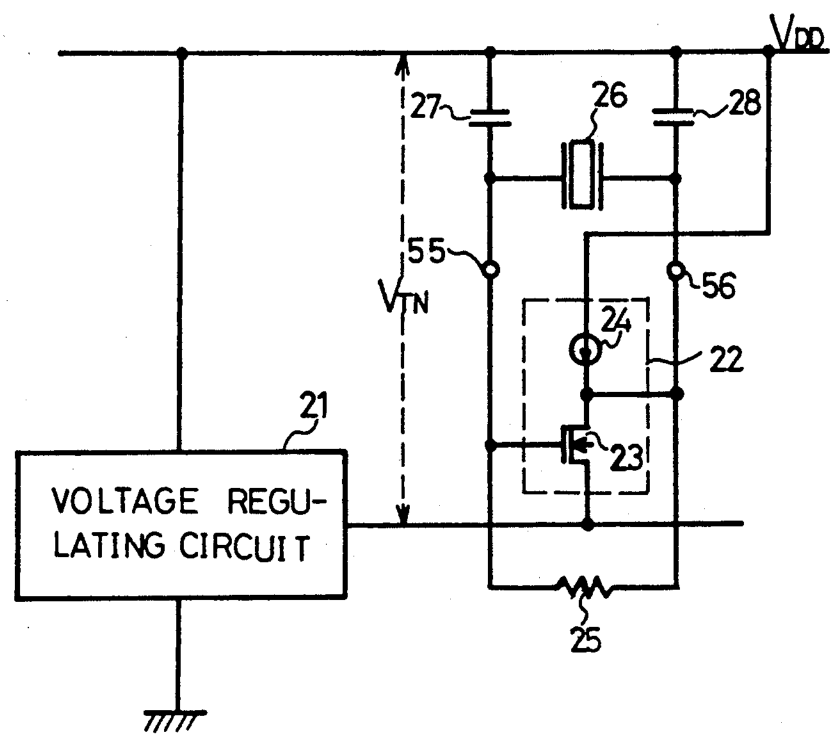
FIG. 4 is a schematic circuit diagram of a low power consumption type crystal oscillation circuit of a second embodiment according to the invention.

As shown in FIG. 4, the oscillation circuit of this second embodiment comprises a voltage regulating circuit 21; a constant-current load type inverter circuit 22 including a constant-current source 24 and an NMOS-FET 23; a resistor 25; a crystal resonator 26; and capacitors 27, 28. In other words, the oscillation circuit is formed, with respect to the output of the voltage regulating circuit 21, by the constant-current load type inverter circuit 22; a feedback circuit consisting of the resistor 25 and the capacitors 27, 28; and the crystal resonator 26.

In contrast to the circuit of the above explained first embodiment wherein the regulated voltage is set with respect to the ground level, the regulated voltage in the circuit of this second embodiment is set as a voltage with respect to the level of the power supply voltage ($V_{DD}$). More specifically, the regulated voltage outputted from the voltage regulating circuit 21 is supplied to the source electrode of the NMOS-FET 23 of the inverter circuit 22. The output voltage of the voltage regulating circuit 21 is set to a level in the order of $V_{TN}$ which is an oscillation starting voltage for the NMOS-FET 23.

Where, for realizing the circuit of the present invention in a semiconductor integrated circuit device, a process of P-well type with an N-type semiconductor substrate is employed, it is more desirable to use the second embodiment. The reason therefor is that, since the PMOS-FET is formed on the N-type semiconductor substrate thereby permitting in use the source to be connected to the power supply line, it is possible to prevent the occurrence of the phenomena of increasing the threshold voltage by the body effect. Conversely, where a process of N-well type with a P-type semiconductor substrate is employed, it is more desirable to use the first embodiment.

As explained above, according to the present invention, by using the constant-current load type inverter circuit as an inverting amplifier for oscillation, the supply voltage from the voltage regulating circuit which is required as an oscillation starting voltage can be effectively suppressed to a low level in the order of the threshold voltage $|V_{TP}|$ of the PMOS-FET, thereby enabling to make a substantial reduction in the current consumption.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A crystal oscillation circuit comprising:
- a voltage regulating circuit (11) for outputting a predetermined regulated output voltage;
- a constant-current load type inverter circuit (12) having a constant-current source (14) and a P-channel MOS field effect transistor (13) having a source electrode connected to an output terminal of said voltage regulating circuit so as to receive said predetermined regulated output voltage;
- a crystal resonator (16) connected between an input and an output terminal (53,54) of said inverter circuit; and
- a feedback circuit connected between said input and output terminals of said inverter circuit and having a resistor (15) and capacitors (17,18).

2. A crystal oscillation circuit according to claim 1, in which said crystal resonator and said capacitors constitute a $\pi$-type feedback circuit connected between said input and output terminals of said inverter circuit.

3. A crystal oscillation circuit comprising:
- a voltage regulating circuit (21) for outputting a predetermined regulated output voltage;
- a constant-current load type inverter circuit (22) having a constant-current source (24) and an N-channel MOS field effect transistor (23) having a source electrode connected to an output terminal of said voltage regulating circuit so as to receive said predetermined regulated output voltage;
- a crystal resonator (26) connected between an input and an output terminal (55,56) of said inverter circuit; and
- a feedback circuit connected between said input and output terminals of said inverter circuit and having a resistor (25) and capacitors (27,28).

4. A crystal oscillation circuit according to claim 3, in which said crystal resonator and said capacitors constitute a $\pi$-type feedback circuit connected between said input and output terminals of said inverter circuit.

* * * * *